(12) United States Patent
Shoji (10) Patent No.: US 7,301,135 B2
(45) Date of Patent: Nov. 27, 2007

(54) PHOTODETECTOR HAVING AN ELECTROSTATIC RECORDING BODY AND PHOTODETECTING METHOD THEREOF

(75) Inventor: Takashi Shoji, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 320 days.

(21) Appl. No.: 10/153,792

(22) Filed: May 24, 2002

(65) Prior Publication Data

US 2002/0175271 A1    Nov. 28, 2002

(30) Foreign Application Priority Data

May 28, 2001    (JP)    ............... 2001-158314

(51) Int. Cl.
*H01L 31/00*    (2006.01)

(52) U.S. Cl. ............... 250/214.1; 250/370.09; 250/591; 430/48

(58) Field of Classification Search ............. 250/214.1, 250/214 LA, 591, 370.09, 370.12, 370.13; 399/66; 430/48, 55; 347/129, 154

See application file for complete search history.

(56) References Cited

U.S. PATENT DOCUMENTS

| | | | | |
|---|---|---|---|---|
| 4,207,100 A | * | 6/1980 | Kadokura et al. | ............ 430/48 |
| 4,535,468 A | * | 8/1985 | Kempter | ............ 378/31 |
| 5,492,783 A | * | 2/1996 | Utsumi et al. | ............ 430/48 |
| 6,268,614 B1 | * | 7/2001 | Imai | ............ 250/591 |
| 6,373,063 B1 | * | 4/2002 | Imai | ............ 250/370.09 |
| 6,518,557 B1 | * | 2/2003 | Izumi et al. | ............ 250/208.1 |
| 7,045,790 B2 | * | 5/2006 | Shoji | ............ 250/370.15 |
| 2002/0179868 A1 | * | 12/2002 | Shoji | ............ 250/580 |

OTHER PUBLICATIONS

Junichi Yamazaki et al.; Avalanche-Type Ultra-High-Sensitive Pickup Tube; Journal of Institute of Television Engineers of Japan; vol. 46; No. 9, 1992; pp. 1189-1198.

* cited by examiner

*Primary Examiner*—Georgia Epps
*Assistant Examiner*—Patrick J. Lee
(74) *Attorney, Agent, or Firm*—Sughrue Mion Pllc.

(57) ABSTRACT

An electrostatic recording body is constructed by laminating a glass substrate transmissive of recording light, a first conductive layer transmissive of recording light, a photoconductive layer exhibiting conductivity by receiving recording light, an insulating dielectric layer, and a second conductive layer transmissive of readout light, in this order. DC voltage is applied to the electrostatic recording body by a power source to charge both conductive layers, and an object is irradiated with light from a recording light irradiating means, thereby recording a electrostatic latent image at an interface between the photoconductive layer and the dielectric layer. Then, the conductive layers are short-circuited and charged at the same potential, thereby redistributing electrical charges. Exposure is performed by scanning with readout light from a readout exposure means, and current flowing out of the electrostatic recording body is detected by a current detecting means, thus reading out the electrostatic latent image.

13 Claims, 8 Drawing Sheets

PHOTODETECTOR HAVING AN ELECTROSTATIC RECORDING BODY AND PHOTODETECTING METHOD THEREOF

BACKGROUND OF THE INVENTION

1. Field of the Invention

The present invention relates to a photodetector for performing photodetection with high sensitivity by using an amorphous selenium photoconductor, and to a photodetecting method using the photodetector.

2. Description of the Related Art

As a photodetector of high sensitivity with a high S/N ratio, an image pickup tube of a high-gain avalanche rushing amorphous photoconductor (Super-HARP) is currently being developed, which uses an amorphous selenium photoconductor as an image pickup tube photoconductive target ("Ultrahigh Sensitivity Super-HARP Image Pickup Tube"; pp. 1189-1198, Journal of Institute of Television Engineers of Japan, Vol. 46, No. 9). This Super-HARP image pickup tube can greatly increase a quantity of electric charges that can be taken out, by using the amorphous selenium photoconductor as a target and by applying a high voltage to the amorphous selenium photoconductor to cause avalanche amplification. In addition, compared with a conventional image pickup tube, an image much higher in quality can be obtained.

However, since the Super-HARP image pickup tube has a vacuum-tube structure and needs electron beam scanning, the photodetector is increased in size, and a size of a photodetection unit is currently limited to about 1 inch.

Thus, a photodetector which is thin but high in both sensitivity and S/N ratio is desired.

SUMMARY OF THE INVENTION

The present invention was made in view of the foregoing circumstances, and the objects of the present invention are to provide a thin photodetector having high sensitivity and a high S/N ratio and to provide a photodetecting method using the same.

A photodetector according to the present invention includes: an electrostatic recording body constructed by laminating a first conductive layer, a photoconductive layer with amorphous selenium as its principal component, an insulating dielectric layer, and a second conductive layer, in this order; and short-circuiting means for short-circuiting between the first and second conductive layers.

The electrostatic recording body used in the present invention may be constructed by laminating minute conductive members (microplates) and layers other than the foregoing first conductive layer, photoconductive layer, dielectric layer, and second conductive layer.

The photodetector according to the present invention may further include voltage applying means for applying a voltage between the first and second conductive layers, the voltage being for generating avalanche amplification in the photoconductive layer.

In the photodetector according to the present invention, one of the first and second conductive layers may include stripe electrodes composed of a plurality of light transmissive linear electrodes.

In the photodetector of the present invention, the electrostatic recording body and readout exposure means for irradiating a readout light may be integrally formed, and in this case, the readout exposure means may irradiate an EL light.

A first photodetecting method according to the present invention is a photodetecting method for reading out a latent image charge by irradiating an electrostatic recording body with a readout light, from any of the foregoing photodetectors in which a recording light is recorded as the latent image charge. The first photodetecting method includes the step of short-circuiting between first and second conductive layers by the short-circuiting means, and setting the layers at the same potential before irradiation of the readout light.

A second photodetecting method according to the present invention is a photodetecting method for reading out a latent image charge by irradiating an electrostatic recording body with a readout light, from a photodetector in which a recording light is recorded as the latent image charge, and one of first and second conductive layers includes stripe electrodes composed of a plurality of light transmissive linear electrodes. The second photodetecting method includes the steps of: short-circuiting between the first and second conductive layers by short-circuiting means, and setting the layers at the same potential before irradiation of the readout light; and irradiating each of the plurality of stripe electrodes with the readout light, and detecting the latent image charge for each stripe electrode, thereby obtaining one-dimensional information of the latent image charge.

A third photodetecting method according to the present invention is a photodetecting method for reading out a latent image charge by irradiating an electrostatic recording body with a readout light, from a photodetector in which a recording light is recorded as the latent image charge, and one of first and second conductive layers includes stripe electrodes composed of a plurality of light transmissive linear electrodes. The third photodetecting method includes the steps of: short-circuiting between the first and second conductive layers by short-circuiting means, and setting the layers at the same potential before irradiation of the readout light; and scanning each of the plurality of stripe electrodes with the readout light in a longitudinal direction of a stripe, and detecting the latent image charge for each stripe electrode, thereby obtaining two-dimensional information of the latent image charge.

In the photodetector and the photodetecting method using the same according to the present invention, the short-circuiting means is provided for short-circuiting between the first and second conductive layers. After the latent image charge is recorded, the first and second conductive layers are short-circuited by the short-circuiting means and are set at the same potential before irradiation of the readout light. Accordingly, a system where a larger current flows in a brighter portion of an image, i.e., a system of a positive type, is established. Therefore, the photodetector is hardly affected by a fluctuation component (shot noise) proportional to a square root of a detection signal, and there are no effects of power voltage fluctuation. As a result, a thin photodetector high in sensitivity and with a high S/N ratio can be achieved.

DESCRIPTION OF THE PREFERRED EMBODIMENTS

Figure 1:
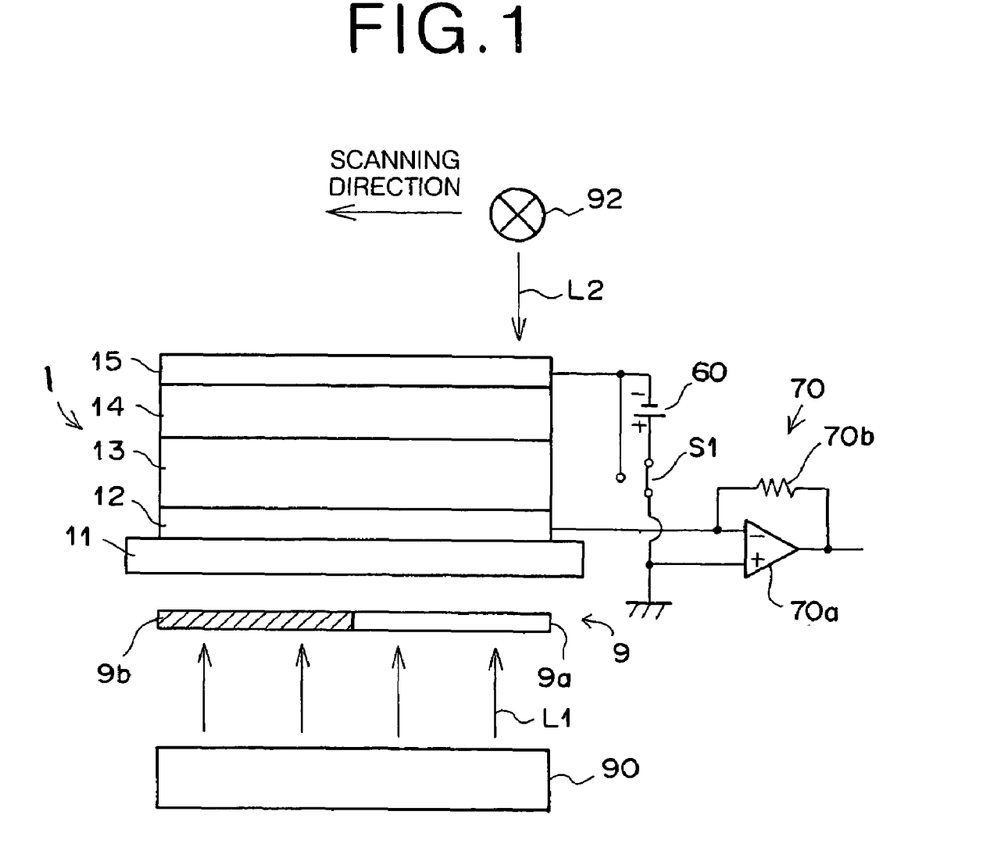
FIG. 1 is a schematic view of a recording and readout system (electrostatic latent image recording apparatus and electrostatic latent image readout apparatus are integrated) using a photodetector according to a first embodiment of the present invention.

Next, description will be made of specific embodiments of a photodetector of the present invention with reference to the accompanying drawings. FIG. 1 is a schematic configuration view showing a recording and readout system (electrostatic latent image recording apparatus and electrostatic latent image readout apparatus are integrated) using a photodetector according to a first embodiment of the present invention.

The recording and readout system includes an electrostatic recording body 1, recording light irradiating means 90, a power source 60, current detecting means 70, readout exposure means 92 and connecting means S1. The electrostatic latent image recording apparatus portion includes the electrostatic recording body 1, the power source 60, the recording light irradiating means 90, and the connecting means S1; meanwhile, the electrostatic latent image readout apparatus portion includes the electrostatic recording body 1 and the current detecting means 70.

The electrostatic recording body 1 is constructed by laminating a glass substrate 11 capable of transmitting a recording light L1, a first conductive layer 12 capable of transmitting the recording light L1, a photoconductive layer 13 exhibiting conductivity upon irradiation of the recording light L1, an insulating dielectric layer 14, and a second conductive layer 15 capable of transmitting a readout light L2, in this order.

In this case, for example, indium tin oxide (ITO) is suitable for the conductive layers 12 and 15, and for the photoconductive layer 13, a photoconductive material with amorphous selenium (a-Se) or the like as its principal component and exhibiting avalanche amplification is suitable. Since amorphous selenium has high sensitivity with respect to a wavelength of 500 nm or less, but has low sensitivity with respect to a wavelength of 500 nm or more, it is possible to provide sensitivity to an entire visible range by Te doping.

The electrostatic recording body 1 is not limited to the above-described layer structure. For example, electric charge injection preventive layers may be provided under the photoconductive layer 13 and on the dielectric layer 14.

The second conductive layer 15 of the electrostatic recording body 1 is connected to a negative electrode of the power source 60. A positive electrode of the power source 60 is grounded through the connecting means S1, and is connected to the current detecting means 70. The first conductive layer 12 is connected to the current detecting means 70. The current detecting means 70 includes a detection amplifier 70a composed of an operational amplifier, and a feedback resistor 70b, constituting a so-called current/voltage conversion circuit.

An object 9 is disposed below the glass substrate 11. The object 9 has a portion 9a transmissive of the recording light L1, and a shutting-off portion (light shielding portion) 9b not transmissive of the recording light L1. The recording light irradiating means 90 uniformly irradiates the object 9 with the recording light L1.

When an electrostatic latent image is read out by uniformly irradiating the second conductive layer 15 of the electrostatic recording body 1 with a readout light, the electrostatic latent image having been recorded in the electrostatic recording body 1 by the recording light L1, the electrostatic recording body 1 functions as a 0-dimensional sensor for detecting the recording light L1. When the electrostatic latent image is read out by linearly scanning the second conductive layer 15 of the electrostatic recording body 1 with the readout light, the electrostatic latent image having been recorded in the electrostatic recording body 1 by the recording light L1, the electrostatic recording body 1 functions as a one-dimensional sensor for detecting the recording light L1.

In the present embodiment, the readout exposure means 92 executes scanning exposure with the readout light L2 such as an infrared laser beam in the direction indicated by the arrow in FIG. 1. Preferably, the readout light L2 should have a shape of a beam converged to a small diameter.

Figure 2A:
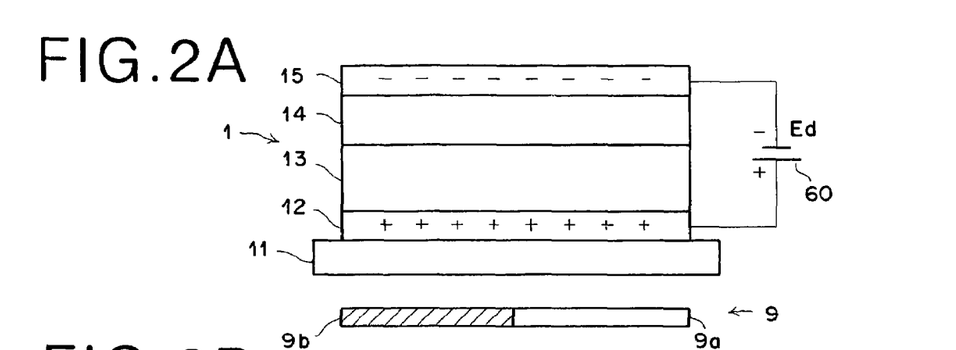
FIGS. 2A to 2D are descriptive diagrams, showing a method for recording an electrostatic latent image in an electrostatic recording body.

Next, description will be made of an electrostatic latent image recording process and an electrostatic latent image readout process in the recording and readout system configured in the foregoing manner. First, the electrostatic latent image recording process will be described by referring to an electric charge model (FIGS. 2A to 2D). In FIG. 1, the connecting means S1 is connected to the power source 60 side, and a DC voltage Ed is applied between the conductive layers 12 and 15 by the power source 60. By the power source 60, negative charges are charged in the conductive layer 15, and positive charges are charged in the conductive layer 12 (FIG. 2A). Accordingly, in the electrostatic recording body 1, a parallel electric field is generated between the conductive layers 12 and 15. In this case, a DC voltage Ed is set so as to apply electric field strength of about $100V/\mu$ to the photoconductive layer 13, and thus avalanche amplification occurs in the photoconductive layer 13. As a result, a quantity of generated electric charges can be amplified to obtain a sufficiently large signal. A ratio of bright and dark currents is simultaneously increased to obtain a signal with a high S/N ratio.

Subsequently, the object 9 is uniformly irradiated with the recording light L1 from the recording light irradiating means 90. The recording light L1 is transmitted through the transmission portion 9a of the object 9, and then transmitted through the glass substrate 11 and the conductive layer 12. The photoconductive layer 13 receives this transmitted recording light L1 to exhibit conductivity. This conductivity is understood when the photoconductive layer 13 operates as a variable resistor exhibiting a resistance value variable according to a quantity of the recording light L1. The resistance value depends on charge pairs of electrons (negative charges) and holes (positive charges) generated by the recording light L1. A large resistance value is exhibited when a quantity of the recording light L1 transmitted through the object 9 is small (see FIG. 2B). If radioactive rays such as X-rays are used as the recording light L1, a quantity of light should be expressed by a dose. However, a quantity of light used herein also expresses a dose. In the drawing, negative and positive charges (−) and (+) generated by the recording light L1 are indicated by being enclosed in circles, respectively.

Figure 2B:
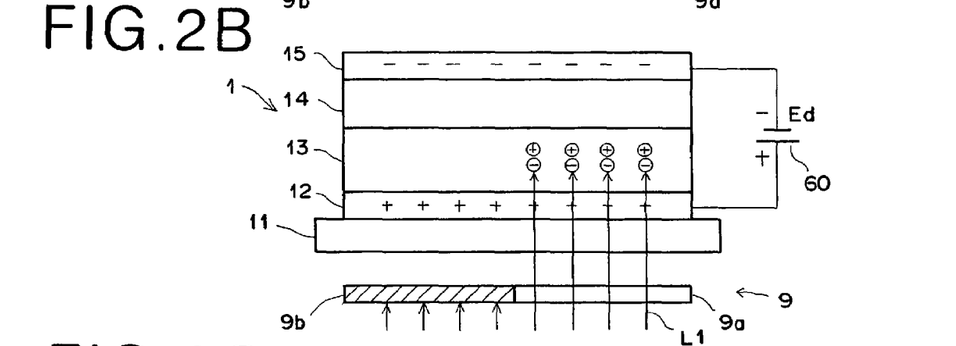
Figure 2C:
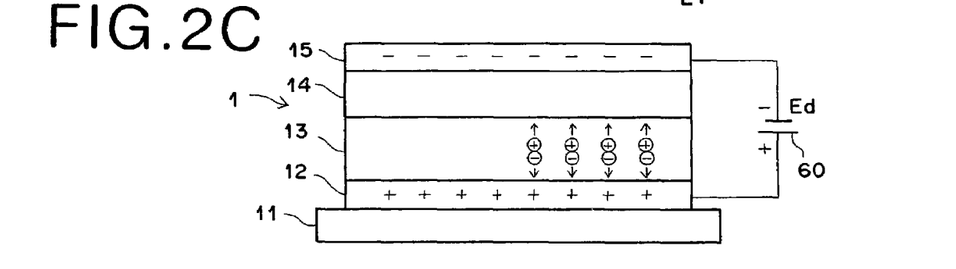
Figure 2D:
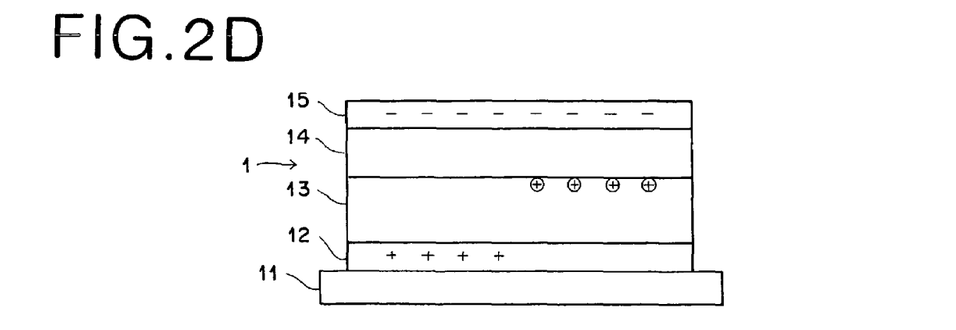

The negative charges generated in the photoconductive layer 13 move therein toward the conductive layer 12 at a high speed, and then disappear after being recombined with the positive charges applied to the conductive layer 12 at an interface between the conductive layer 12 and the photoconductive layer 13 (see FIGS. 2C and 2D). On the other hand, the positive charges generated in the photoconductive layer 13 move therein toward the dielectric layer 14. As the dielectric layer 14 functions as an insulator, the positive charges that have moved through the photoconductive layer 13 are stopped at an interface between the photoconductive layer 13 and the dielectric layer 14, and are stored at the interface (see FIGS. 2C and 2D). A quantity of electric charges to be stored is decided based on a quantity of positive charges generated in the photoconductive layer 13, i.e., a quantity of the recording light L1 transmitted through the object 9.

On the other hand, since the recording light L1 is not transmitted through the light shielding portion 9b of the object 9, no changes occur in a part above the light shielding portion 9b of the electrostatic recording body 1 (see FIGS. 2B to 2D).

Thus, by irradiating the object 9 with the recording light L1, electric charges according to an image of the object can be stored at the interface between the photoconductive layer 13 and the dielectric layer 14. The image of the object by the stored electric charges is called an electrostatic latent image. As apparent from the foregoing description, the apparatus for recording the electrostatic latent image in the electrostatic recording body 1 according to the present invention has a very simple configuration, and thus a recording operation becomes very simple.

Figure 3A:
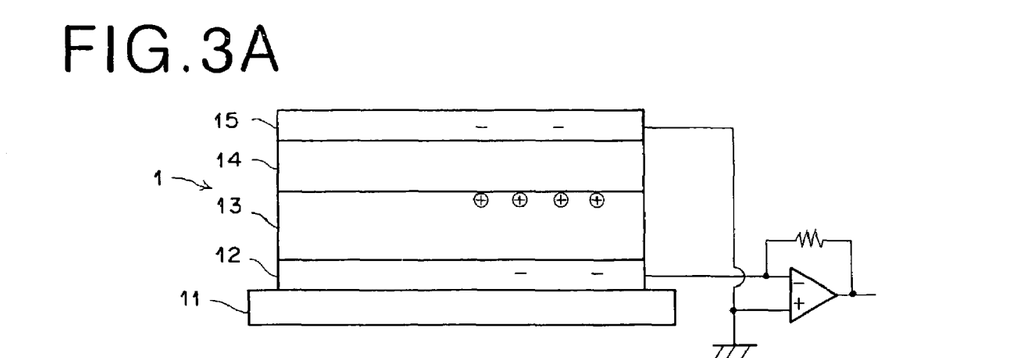
FIGS. 3A to 3C are descriptive diagrams, showing a method for reading out the electrostatic latent image recorded in the electrostatic recording body.
Figure 3B:
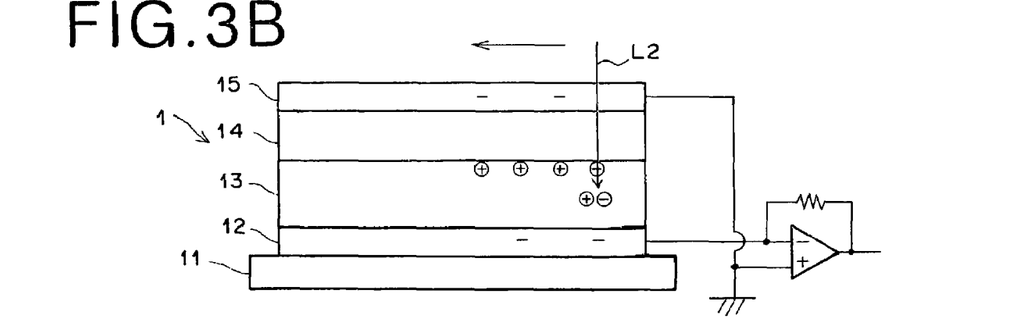
Figure 3C:
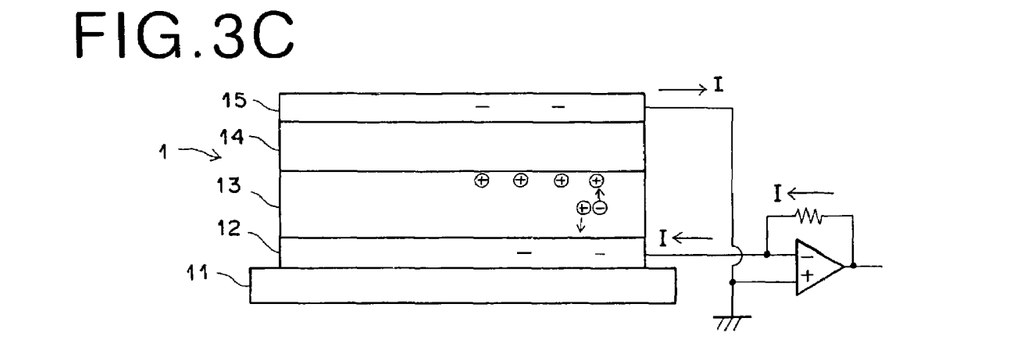

Next, description will be made of a process of reading out an electrostatic latent image by referring to an electric charge model (FIGS. 3A to 3C). The connecting means S1 is released to stop the power supply, and electric charges are redistributed by setting the conductive layers 12 and 15 of the electrostatic recording body 1 at the same potential, the electrostatic recording body 1 having the electrostatic latent image recorded as described above (see FIG. 3A).

When the readout exposure means 92 executes exposure by scanning from the conductive layer 15 side of the electrostatic recording body 1 with the readout light L2, the readout light L2 is transmitted through the conductive layer 15 and the dielectric layer 14. Then, the photoconductive layer 13 irradiated with the transmitted readout light L2 exhibits conductivity according to scanning exposure (see FIG. 3B). Similarly to the recording process, negative and positive charges (−) and (+) generated by the readout light L2 are indicated by being enclosed in circles, respectively, in the drawing.

The positive charges generated in the photoconductive layer 13 move therein toward the conductive layer 12 at a high speed, and disappear after being recombined with the negative charges applied to the conductive layer 12 at the interface between the conductive layer 12 and the photoconductive layer 13 (see FIG. 3C). On the other hand, the negative charges generated in the photoconductive layer 13 move therein toward the dielectric layer 14, and disappear after being recombined with stored charges at the interface between the photoconductive layer 13 and the dielectric layer 14 (see FIG. 3C). Thus, as a result of the disappearance of the electric charges stored in the electrostatic recording body 1, a current I flows from the conductive layer 15 to the conductive layer 12 to maintain electric field balance. This current I is converted into a voltage by the current detecting means 70 and is detected.

Generally, when an electrostatic latent image is read out, in addition to a signal current generated by the disappearance of stored charges, a dark current proportional to a quantity of all electric charges stored in the electrostatic recording body also flows, and the signal current is superposed on the dark current and detected. This means that the read out electrostatic latent image contains noise caused by the dark current. Ideally, no stored electric charges are present in the electrostatic recording body 1 after the electrostatic latent image is read out in the above-described manner. Thus, a deletion process is not necessary for further recording of an electrostatic latent image in the electrostatic recording body 1, whereby it is possible to perform the above-described recording process immediately. Actually, however, the electrostatic latent image may slightly remain in the electrostatic recording body. In such a case, the remaining electrostatic latent image can be deleted by irradiation with the readout light again.

Next, detailed description will be made of a recording and readout system using a photodetector according to a second embodiment of the present invention by referring to FIGS. 4A to 4C, and FIGS. 5 and 6. In these drawings, components similar to those in FIG. 1 are denoted by similar reference numerals, and description thereof will be omitted unless particularly necessary.

Figure 4A:
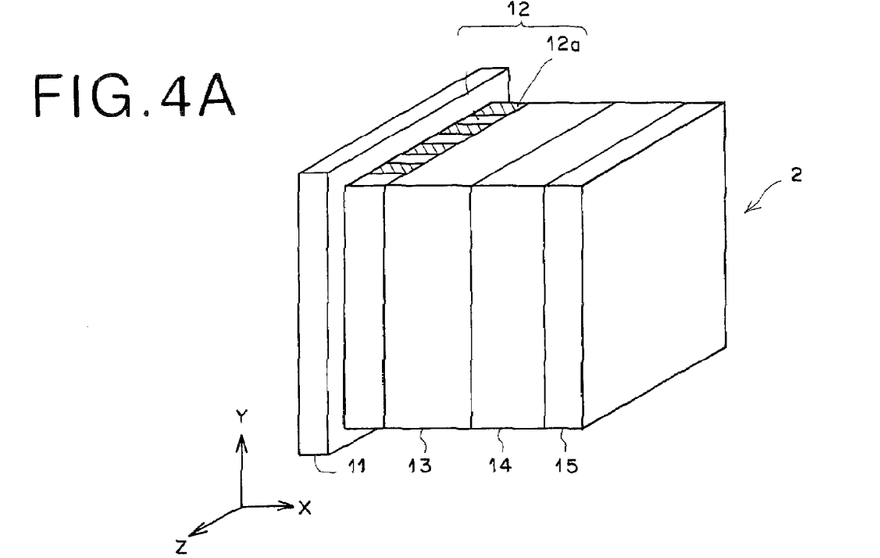
FIG. 4A is a perspective view showing an electrostatic recording body of a recording and readout system using a photodetector according to a second embodiment of the present invention.
Figure 4B:
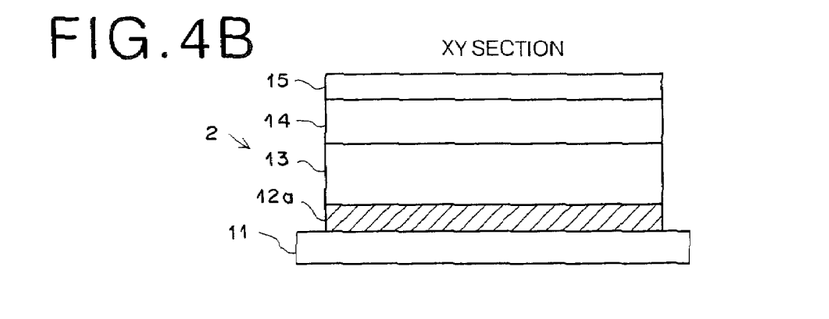
FIGS. 4B and 4C are sectional views of the electrostatic recording body, which are cut along an XY plane and an XZ plane of FIG. 4A, respectively.
Figure 4C:
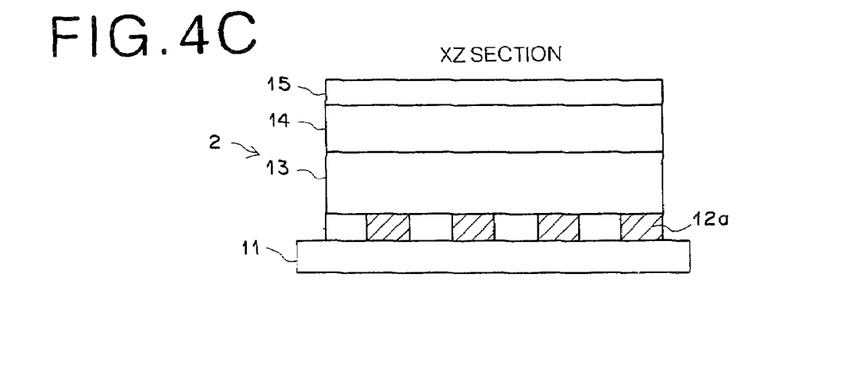

FIG. 4A is a perspective view of an electrostatic recording body 2 according to the second embodiment; and FIGS. 4B and 4C are sectional views of the electrostatic recording body 2, which are cut along an XY plane and an XZ plane of FIG. 4A, respectively. This electrostatic recording body 2 is different from the electrostatic recording body 1 according to the foregoing first embodiment in that a conductive layer 12 includes stripe electrodes composed of a plurality of light transmissive linear electrodes.

For the electrostatic recording body 2 according to the embodiment, the one manufactured as described below is used.

After ITO is deposited by sputtering to form the conductive layer 12 on a glass substrate 11, etching is carried out to form a stripe electrode 12a. Then, amorphous selenium is thermally deposited to a thickness of 4 to 25 μm on the stripe electrode 12a, thus forming a photoconductive layer 13. Then, PET or polyimide is coated or deposited on the photoconductive layer 13 to form a dielectric layer 14. Lastly, ITO is deposited on the dielectric layer 14 to form a second conductive layer 15.

In this case, an electric charge injection preventive layer may be formed by thinly depositing $CeO_2$ between the conductive layer 12 and the photoconductive layer 13.

When an electrostatic latent image is read by uniformly irradiating the second conductive layer 15 of the electrostatic recording body 2 with a readout light, the electrostatic latent image having been recorded in the electrostatic recording body 2 by a recording light L1, the electrostatic recording body 2 functions as a one-dimensional sensor for detecting the recording light L1. When the electrostatic latent image is read by linearly scanning the second conductive layer 15 of the electrostatic recording body 2 with the readout light, the electrostatic latent image having been recorded in the electrostatic recording body 2 with the recoding the light L1, the electrostatic recording body 2 functions as a two-dimensional sensor for detecting the recording light L.

In the present embodiment, description will be made of a mode of allowing the electrostatic recording body 2 to function as the two-dimensional sensor.

Figure 5:
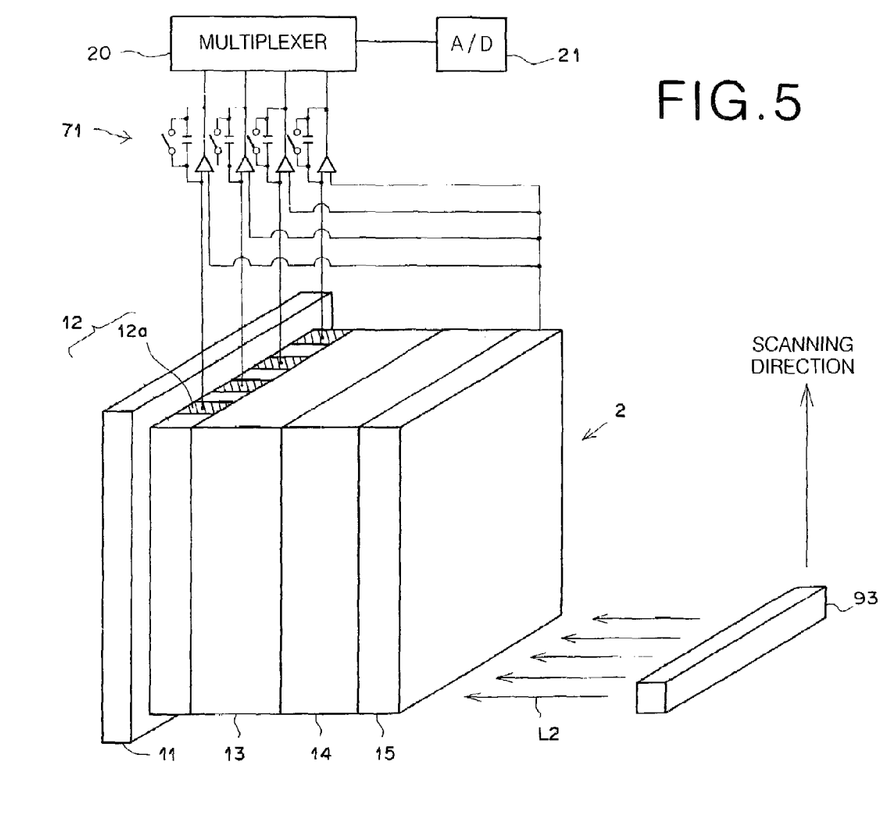
FIG. 5 is a schematic view of the recording and readout system using the photodetector according to the second embodiment of the present invention.

Next, description will be made of processes of recording and reading out an electrostatic latent image of the electrostatic recording body 2 by referring to a recording and readout system shown in FIG. 5. As shown in FIG. 5, this system includes the electrostatic recording body 2, current detecting means 71, recording light irradiating means (not shown), and readout exposure means 93. The readout exposure means 93 executes scanning exposure in a longitudinal direction of the stripe electrode 12a, i.e., a scanning direction indicated by an arrow in the drawing, with a substantially uniform readout light L2 in lines roughly orthogonal to the longitudinal direction of the stripe electrode 12a of the conductive layer 12 (such exposing means is called line exposing means). By using the electrostatic recording body 2 as described above, the readout exposure means 93 can be composed of the line exposing means without using any laser beams, thus making it possible to construct a readout apparatus by a scanning optical system very simple in configuration and low in cost. In addition, since an incoherent light source can be used, it is possible to prevent generation of interference fringe noise generated in the glass substrate 11. Note that the readout apparatus can be constituted of an apparatus for executing scanning exposure with a beam-like readout light such as that shown in FIG. 1.

Figure 6:
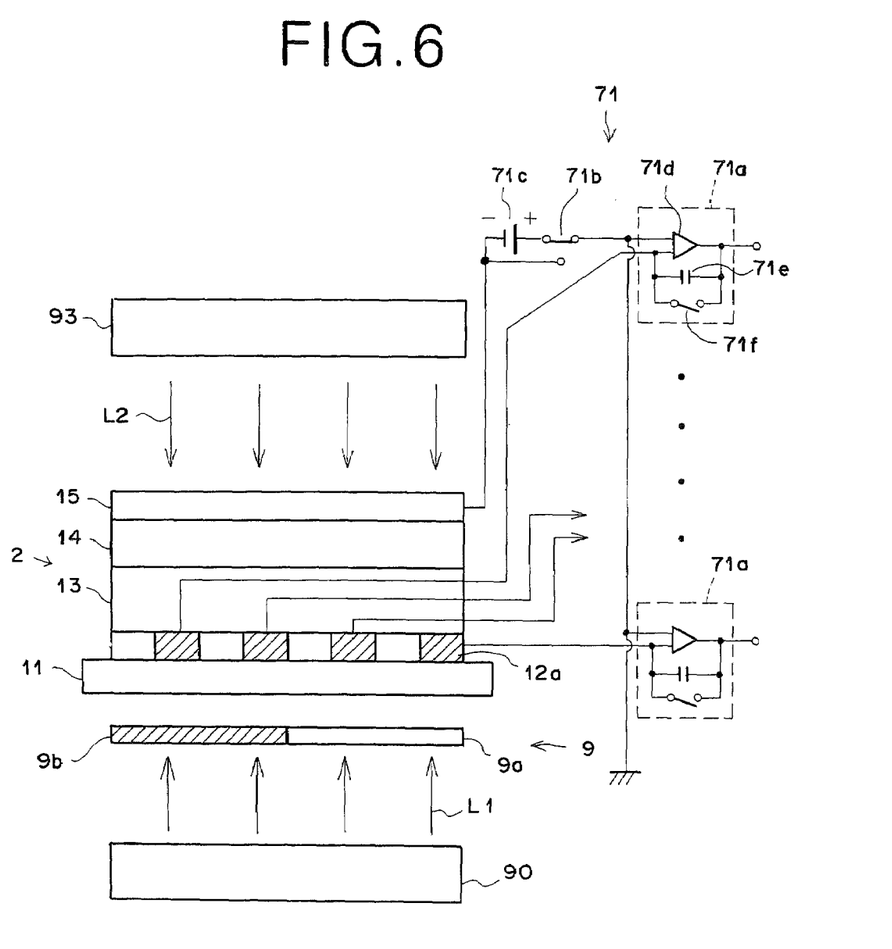
FIG. 6 is a schematic view of the recording and readout system using the photodetector according to the second embodiment of the present invention.

FIG. 6 is a block diagram showing in detail the current detecting means 71 together with a side section of the electrostatic recording body 2.

As shown in FIG. 6, the current detecting means 71 includes a plurality of current detection amplifiers 71a connected to each of the stripe electrodes 12a of the conductive layer 12, and detects currents in parallel for every stripe electrode 12a, the currents flowing to the respective stripe electrodes 12a upon exposure with the readout light L2. The conductive layer 15 of the electrostatic recording body 2 is connected to a negative electrode of a power source 71c. A positive electrode of the power source 71c is grounded through a connecting means 71b, and connected to the current detection amplifier 71a.

Hereinafter, description will be made of a method of recording an electrostatic latent image in the electrostatic recording body 2, and of reading out the electrostatic latent image from the electrostatic recording body 2.

First, the connecting means 71b is connected to the positive electrode of the power source 71c, and an electrostatic latent image is recorded in the electrostatic recording body 2 by a method similar to that of the first embodiment. After finishing the recording, the connecting means 71b is connected to the conductive layer 15 of the electrostatic recording body 2. By executing scanning exposure with the readout light L2 by the readout exposure means 93, a current I flows from the conductive layer 15 of the electrostatic recording body 2 through the current detection amplifier 71a to each stripe electrode 12a of the conductive layer 12. At each current detection amplifier 71a, an integrating capacitor 71e is charged by this current I, electric charges are stored in the integrating capacitor 71e according to a quantity of the flowing current, and voltages in both ends of the integrating capacitor 71e are changed. Thus, by turning on connecting means 71f to discharge the electric charges stored in the integrating capacitor 71e between pixels during the scanning exposure, changes in voltages are observed in the both ends of the integrating capacitor 71e one after another corresponding to electric charges stored for each pixel. The change in voltage corresponds to electric charges stored for each pixel in the electrostatic recording body 2. Further, an output of the current detection amplifier 71a connected to each stripe electrode 12a is entered to a multiplexer 20 and synthesized with another, and is subjected to digital conversion by an AD converter 21. Thus, a two-dimensional image can be obtained, which is expressed by the electrostatic latent image recorded in the electrostatic recording body 2.

Figure 7:
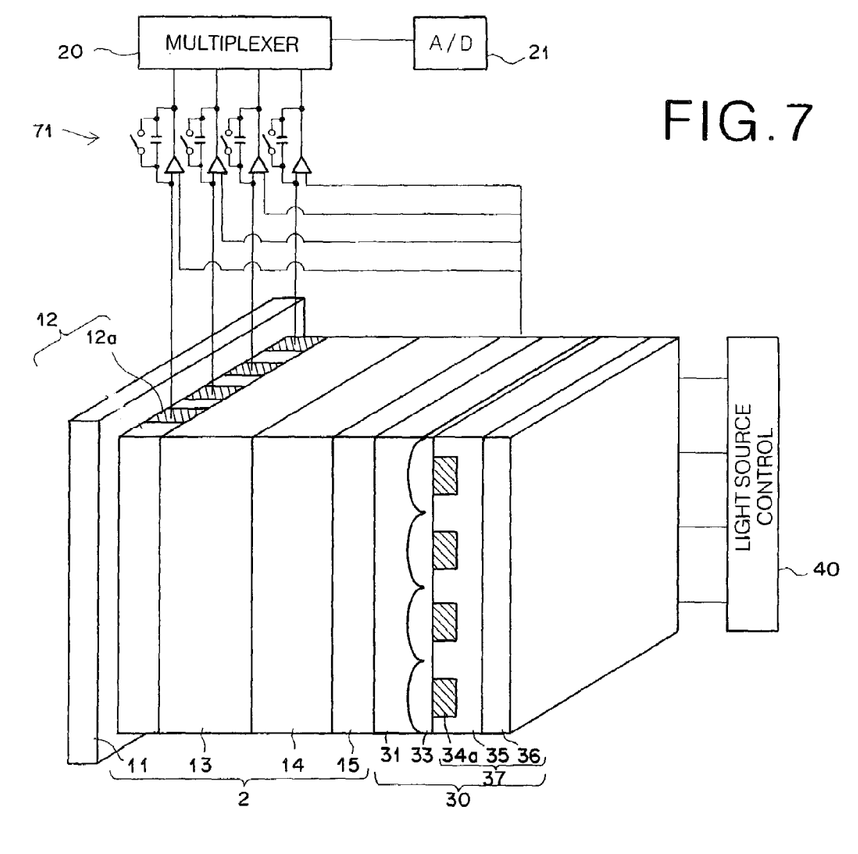
FIG. 7 is a schematic view of a recording and readout system using a photodetector according to a third embodiment of the present invention.

Next, detailed description will be made of a recording and readout system using a photodetector according to a third embodiment of the present invention by referring to FIG. 7. In FIG. 7, components similar to those in FIG. 1 are denoted by the same reference numerals, and description thereof will be omitted unless particularly necessary.

FIG. 7 is a configuration view of the recording and readout system (recording light irradiating means is not shown) according to the third embodiment. This recording and readout system is different from the recording and readout system of the foregoing second embodiment in that an electrostatic recording body 2 and a planar light source 30 are integrally formed.

Figure 8A:
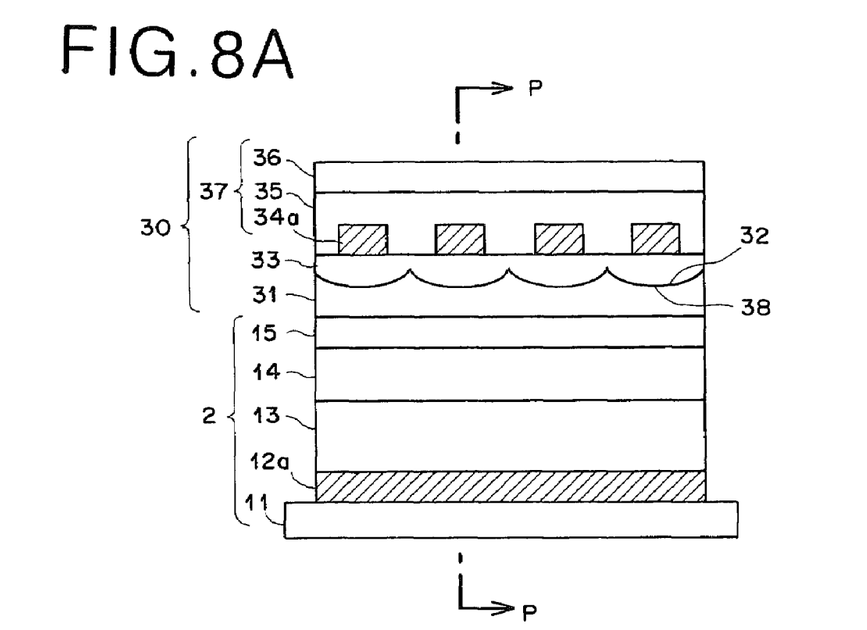
FIGS. 8A and 8B are schematic views of the recording and readout system using the photodetector according to the third embodiment of the present invention.
Figure 8B:
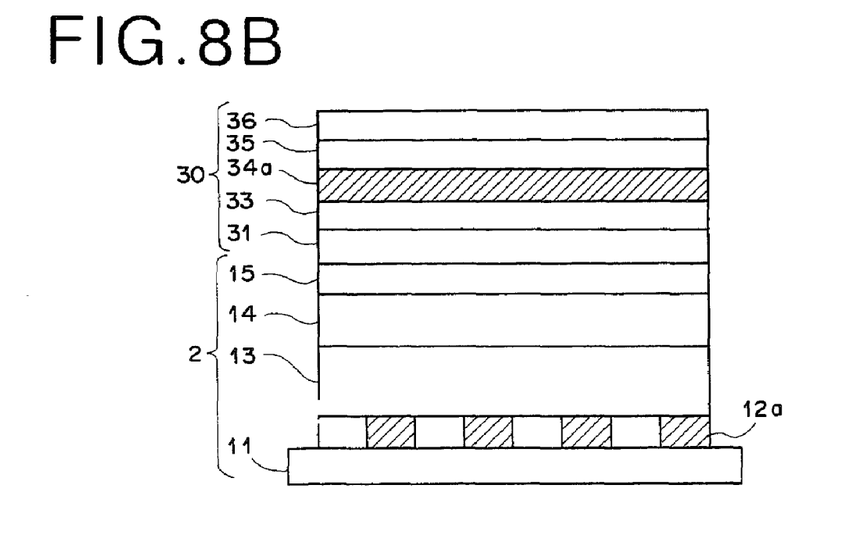

Each of FIGS. 8A and 8B is a schematic constitutional view of the electrostatic recording body 2 and the planar light source 30 of the embodiment. FIG. 8A is a sectional view of the electrostatic recording body 2 and the planar light source 30; and FIG. 8B is a sectional view taken on the line P-P in FIG. 8A.

The planar light source 30 includes a number of minute line EL illuminators 37 and a glass substrate 31. Each minute line EL illuminator 37 includes a stripe electrode 34a, an EL layer 35 and a flat plate electrode 36.

For the planar light source 30 used in the recording and readout system of the embodiment, one manufactured as described below is used.

First, on a surface of the glass substrate 31, on which the minute line EL illuminators 37 are disposed, a number of minute concave grooves 38 having curved bottoms are formed at a pitch of 100 μm by press molding.

Then, an insulating layer 33 is formed on the glass substrate by coating or the like. For this insulating layer 33, one having high resistance to etching is used. By selecting a material of a suitable refractive index (one having a larger refractive index than that of the glass substrate 31 in the present embodiment) for the insulating layer 33, a light is refracted on an interface 32 between the insulating layer 33 and the glass substrate 31. Accordingly, each minute concave groove 38 of the glass substrate 31 functions as a cylindrical lens.

Subsequently, Idemitsu Indium X-metal Oxide (IDIXO; Idemistu Kosan (Co., Ltd.)), which is an amorphous light transmissive oxide film, is deposited on the insulating layer 33. Then, by carrying out etching for the IDIXO so as to match the optical center of each minute concave groove 38 with the center of an electrode, a stripe electrode 34a made of IDIXO is formed.

IDIXO is an easily etched film. By using this IDIXO as an electrode member constituting the stripe electrode 34a, the possibility of melting the insulating layer 33 during etching is reduced, and the selection range of the insulating layer 33 is also expanded.

Then, an EL layer 35 is formed on the stripe electrode 34a on the glass substrate 31. This EL layer 35 may be an inorganic EL layer made of an inorganic material, or an organic EL layer made of an organic material.

Lastly, a conductive layer is formed such that a flat plate electrode 36 can be formed on the El layer 35. Preferably, the flat plate electrode 36 should be made of MgAg which allows roughly total reflection of an EL light emitted from the EL layer 35.

The planar light source 30 and electrostatic recording body 2 thus manufactured are adhered to each other such that the conductive layer 15 and the glass substrate 31 are opposite each other, and the stripe electrode 12a of the electrostatic recording body 2 and the stripe electrode 34a of the planar light source 30 are set orthogonal to each other. Thus, both of the planar light source 30 and the electrostatic recording body 2 are united together.

The stripe electrode 34a and flat plate electrode 36 of the planar light source 30 are connected to light source control means 40. The light source control means 40 applies a predetermined DC voltage between the stripe electrode 34a and the flat plate electrode 36 while sequentially switching one stripe electrode 34a to another. The application of the DC voltage causes the El light to be emitted from the EL layer 35 held between the stripe electrode 34a and the flat plate electrode 36. Since the stripe electrode 34a is line-shaped (linear), the El light transmitted through the stripe electrode 34a can be used as a line readout light. That is, the planar light source 30 has an array of a plurality of the minute line EL illuminators 37 composed of the stripe electrode 34a, the El layer 35 and the flat plate electrode 36. By sequentially switching the stripe electrodes 34a to emit the El light from the EL layer 35, the electrostatic recording body 2 can be electrically scanned with the line readout light.

In the foregoing description, the positive charges are stored at the interface between the photoconductive layer and the dielectric layer by applying positive and negative charges to the first and second conductive layers of the electrostatic recording body, respectively. However, the present invention is not limited to such an arrangement. The electric charges may have reverse polarities. If the polarities are reversed, by making slight changes such as polarity reversal of a power source during recording, it is possible to achieve a recording and readout system similar to that described above.

Furthermore, in the foregoing description, the recording light is irradiated from the side of the first conductive layer. However, the present invention is not limited to the above. Specifically, if the second conductive layer and the dielectric layer are set to be capable of transmitting the recording light, the recording light may be radiated from the second conductive layer side to enable the photoconductive layer to exhibit conductivity. In other words, the electrostatic recording body according to the present invention can be constituted as capable of irradiating the recording light from any directions of the first and second conductive layers.

What is claimed is:

1. A photodetector, comprising:
    an electrostatic recording body constructed by laminating a first conductive layer, a photoconductive layer which has amorphous selenium as its principal component, an insulating dielectric layer, and a second conductive layer in this order, wherein the electrostatic recording body and a readout exposure means are integrally formed, the readout exposure means irradiating a readout light; and
    a means for causing the first conductive layer and the second conductive layer to be of the same electric potential.

2. The photodetector according to claim 1, further comprising voltage applying means for applying a voltage between the first and second conductive layers, the voltage being for generating avalanche amplification in the photoconductive layer.

3. The photodetector according to claim 1, wherein one of the first and second conductive layers includes stripe electrodes composed of a plurality of light transmissive linear electrodes.

4. A photodetecting method for reading out a latent image charge by irradiating the electrostatic recording body with a readout light, from the photodetector of any one of claims 1, 2, and 3, in which a recording light is recorded as the latent image charge, the method comprising the step of:
    causing the first conductive layer and the second conductive layer to be of the same electric potential, and setting the layers at the same potential before irradiation of the readout light.

5. A photodetecting method for reading out a latent image charge by irradiating the electrostatic recording body with a readout light, from the photodetector of claim 3, in which a recording light is recorded as the latent image charge, the method comprising the steps of:
    causing the first conductive layer and the second conductive layer to be of the same electric potential, and setting the layers at the same potential before irradiation of the readout light; and
    irradiating each of the plurality of stripe electrodes with the readout light, and detecting the latent image charge for each stripe electrode, thereby obtaining one-dimensional information of the latent image charge.

6. A photodetecting method for reading out a latent image charge by irradiating the electrostatic recording body with a readout light, from the photodetector of claim 3, in which a recording light is recorded as the latent image charge, the method comprising the steps of:
    causing the first conductive layer and the second conductive layer to be of the same electric potential, and setting the layers at the same potential before irradiation of the readout light; and
    scanning each of the plurality of stripe electrodes with the readout light in a longitudinal direction of a stripe, and detecting the latent image charge for each stripe electrode, thereby obtaining two-dimensional information of the latent image charge.

7. The photodetector according to claim 1, wherein the readout exposure means irradiates an EL light.

8. A photodetecting method for reading out a latent image charge by irradiating the electrostatic recording body with a readout light, from the photodetector of claim 7, in which a recording light is recorded as the latent image charge, the method comprising the step of:
    causing the first conductive layer and the second conductive layer to be of the same electric potential, and setting the layers at the same potential before irradiation of the readout light.

9. The photodetector according to claim 1, wherein the photoconductive layer is in direct contact with the insulating dielectric layer.

10. The photodetector according to claim 1, wherein the photoconductive layer has a thickness of 4 to 25 µm.

11. The photodetector according to claim 1, wherein the photoconductive layer and the insulating dielectric layer comprise an integral body having no air gap between the photoconductive layer and the insulating dielectric layer.

12. A photodetector, comprising:

an electrostatic recording body constructed by laminating a first conductive layer, a single photoconductive layer which has amorphous selenium as its principal component, an insulating dielectric layer, and a second conductive layer in this order, wherein the electrostatic recording body and a readout exposure means are integrally formed, the readout exposure means irradiating a readout light; and a means for causing the first conductive layer and the second conductive layer to be of the same electric potential.

13. The photodetector according to claim 12, wherein the single photoconductive layer is in direct contact with the insulating dielectric layer and the first conductive layer, and the dielectric layer is in direct contact with the second conductive layer.

* * * * *